US012708029B2

(12) United States Patent
Chen et al.

(10) Patent No.: US 12,708,029 B2
(45) Date of Patent: Aug. 11, 2026

(54) SEMICONDUCTOR PACKAGE AND METHOD OF FABRICATING THE SAME

(71) Applicant: Taiwan Semiconductor Manufacturing Company, Ltd., Hsinchu (TW)

(72) Inventors: Chen Chen, New Taipei City (TW); Yu-Hung Lin, Taichung City (TW); Chih-Hao Yu, Tainan City (TW); Wei-Ming Wang, Taichung City (TW); Chia-Hui Lin, Taichung County (TW); Shih-Peng Tai, Hsinchu County (TW)

(73) Assignee: Taiwan Semicondutor Manufacturing Company, Ltd., Hsinchu (TW)

( * ) Notice: Subject to any disclaimer, the term of this patent is extended or adjusted under 35 U.S.C. 154(b) by 365 days.

(21) Appl. No.: 18/484,410

(22) Filed: Oct. 10, 2023

(65) Prior Publication Data

US 2025/0118612 A1 Apr. 10, 2025

(51) Int. Cl.
*H10W 74/10* (2026.01)
*H10W 90/00* (2026.01)
(Continued)

(52) U.S. Cl.
CPC ....... *H10W 74/134* (2026.01); *H10W 74/147* (2026.01); *H10W 90/00* (2026.01);
(Continued)

(58) Field of Classification Search
None
See application file for complete search history.

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 201943038 11/2019
WO 2023273862 1/2023

OTHER PUBLICATIONS

"Office Action of Taiwan Counterpart Application", issued on Mar. 13, 2025, p. 1-p. 4.

*Primary Examiner* — Anthony Ho
(74) *Attorney, Agent, or Firm* — JCIPRNET

(57) ABSTRACT

A semiconductor package includes a photonic integrated circuit (PIC) die having a photonic layer, and an electronic integrated circuit (EIC) die bonded to the PIC die. The EIC die includes an optical region that allows the transmission of optical signals through the optical region towards the photonic layer, and a peripheral region outside of the optical region. The optical region includes optical concave/convex structures, a protection film and optically transparent material layers. The optical concave/convex structures are formed in the semiconductor structure. The protection film is conformally disposed over the optical concave/convex structures. The optically transparent material layers are disposed over the protection film and filling up the optical region. The peripheral region includes first bonding pads bonded to the photonic integrated circuit die, and via structures connected to the first bonding pads, wherein the protection film is laterally surrounding sidewalls of the via structures.

15 Claims, 16 Drawing Sheets

PKX5

(51) Int. Cl.
*G02B 6/42* (2006.01)
*H10W 72/90* (2026.01)

(52) U.S. Cl.
CPC ........... *G02B 6/4204* (2013.01); *H10W 72/90* (2026.01); *H10W 72/923* (2026.01); *H10W 72/934* (2026.01); *H10W 72/941* (2026.01); *H10W 72/9415* (2026.01); *H10W 72/951* (2026.01); *H10W 72/952* (2026.01); *H10W 90/792* (2026.01)

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,756,943 B2 | 9/2023 | Liff et al. | |
| 2022/0413235 A1 | 12/2022 | Darmawikarta et al. | |
| 2023/0194778 A1 | 6/2023 | Kim et al. | |
| 2025/0004202 A1* | 1/2025 | Wang | G02B 6/13 |
| 2025/0052966 A1* | 2/2025 | Huang | G02B 6/305 |

* cited by examiner

SEMICONDUCTOR PACKAGE AND METHOD OF FABRICATING THE SAME

BACKGROUND

Currently, semiconductor packages including both photonic dies (known as P-dies) and electronic dies (known as E-dies) are becoming increasingly popular for their compactness. In addition, due to the widely use of optical fiber-related applications for signal transmission, optical signaling and processing have been used in more applications. Although existing methods of fabricating the semiconductor packages have been generally adequate for their intended purposes, they have not been entirely satisfactory in all respects. For example, challenges rise to develop robust processes for interconnecting among P-dies, E-dies, and optical fibers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
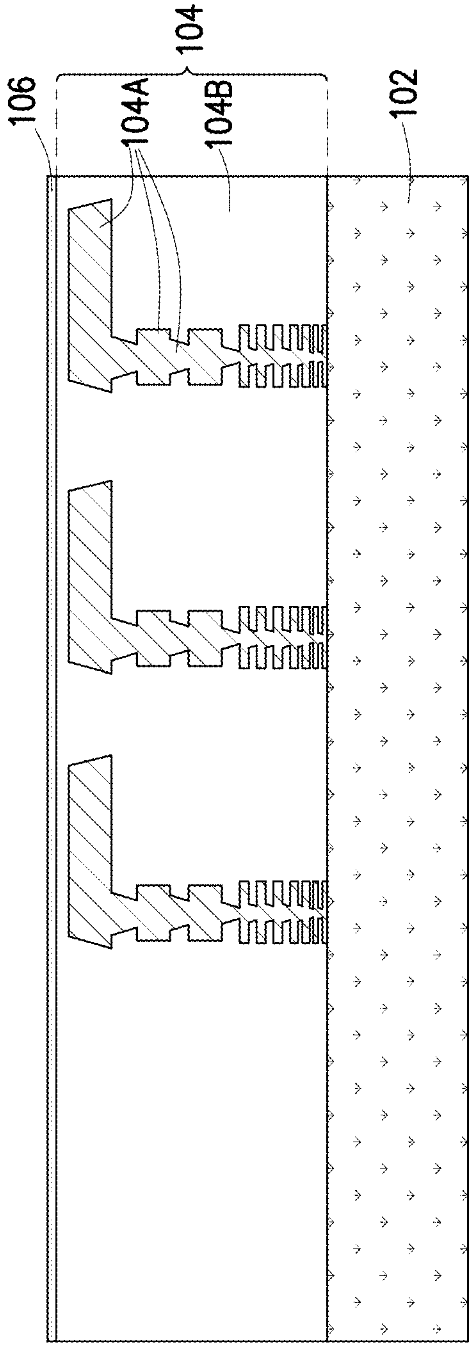
FIG. 1 to FIG. 8 are schematic top and sectional views of various stages in a method of fabricating a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

During fabrication of electronic integrated circuits (EIC) and photonic integrated circuits (PIC), the bonding pads used for hybrid bonding between EIC and PIC wafers are generally formed by damascene, dual damascene, or other processes that utilizes capping layers. However, the presence of these capping layers in the optical path between the EIC and PIC wafers (or EIC and PIC dies) for optical signal transmission will induce optical signal loss. In accordance with some embodiments of the present disclosure, by removing the presence of bonding pads and capping layers along the optical path between the EIC and PIC wafers, the optical signal loss issue is resolved.

FIG. 1 to FIG. 8 are schematic top and sectional views of various stages in a method of fabricating a semiconductor package according to some exemplary embodiments of the present disclosure. Referring to FIG. 1 to FIG. 6, the steps of forming an electronic integrated circuit die 100 is described. As illustrated in FIG. 1, a semiconductor wafer 102 (semiconductor structure) is provided. In some embodiments, the semiconductor wafer 102 is made of an optically transparent material, that allows optical signals to pass through. For example, in one embodiment, the semiconductor wafer 102 is a silicon wafer, which may be singulated or diced at a later stage to form a semiconductor structure or substrate of the electronic integrated circuit die 100.

In some embodiments, an interconnection layer 104 is formed on the semiconductor wafer 102. For example, forming the interconnection layer 104 includes forming a plurality of metallization patterns 104A embedded in dielectric layers 104B. The metallization patterns 104A may include conductive vias, conductive lines or a combination thereof. In some embodiments, the metallization patterns 104A are made of conductive materials such as tungsten (W), copper (Cu), aluminum (Al), titanium (Ti), nickel (Ni), Tantalum (Ta), alloys thereof, or the like, and may be formed by electroplating, deposition, and/or photolithography and etching.

In some embodiments, the dielectric layers 104B include materials such as polyimide, epoxy resin, acrylic resin, phenol resin, benzocyclobutene (BCB), polybenzooxazole (PBO), or any other suitable polymer-based dielectric material. Alternatively, the dielectric layers 104B may be formed of oxides or nitrides, such as silicon oxide, silicon nitride, or the like. The dielectric layers 104B may be formed by suitable fabrication techniques such as spin-on coating, chemical vapor deposition (CVD), plasma-enhanced chemical vapor deposition (PECVD), or the like. In some embodiments, the dielectric layers 104B are formed to laterally surround and cover the plurality of metallization patterns 104A. After forming the interconnection layer 104, a passivation layer 106 may be formed over the interconnection layer 104. For example, the passivation layer 106 may be a silicon oxide layer, a silicon nitride layer, a silicon oxynitride layer or a dielectric layer formed by other suitable dielectric materials. The passivation layer 106 may be formed by any suitable fabrication techniques such as (high-density plasma chemical vapor deposition) HDP-CVD, PECVD, or the like.

Figure 2:
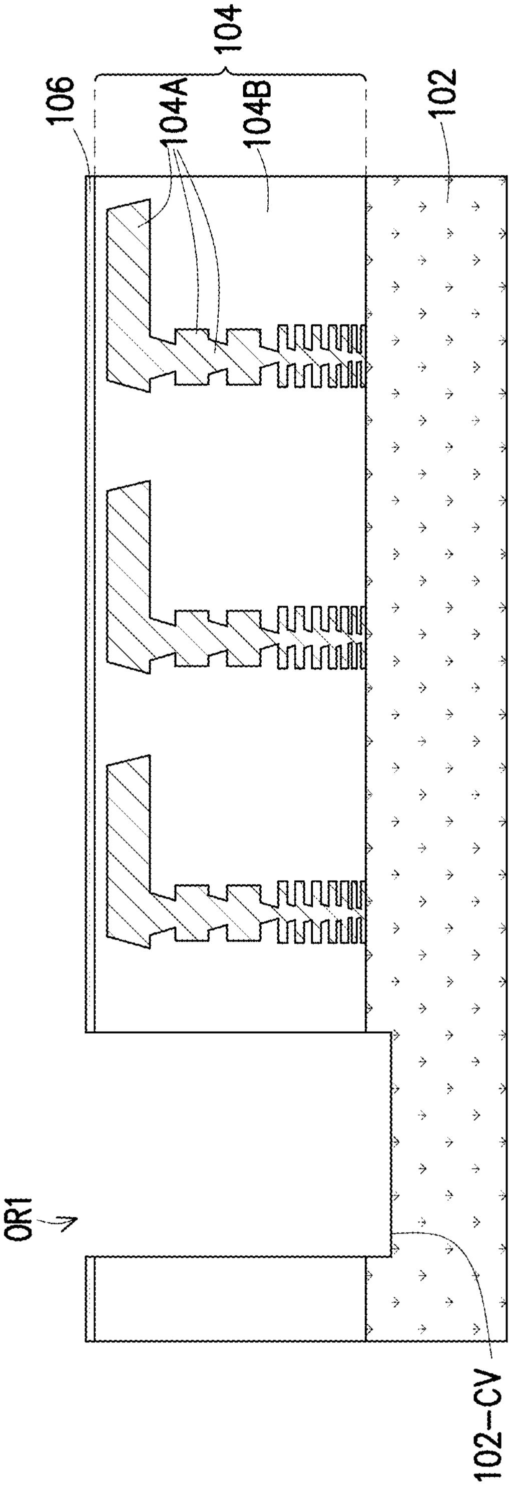

Referring to FIG. 2, in a subsequent step, the interconnection layer 104 and the passivation layer 106 are patterned to form an opening portion OR1. For example, portions of the interconnection layer 104 and portions of the passivation layer 106 are removed to form the opening portion OR1 that reveals the semiconductor wafer 102. In some embodiments, portions of the semiconductor wafer 102 are further removed to form a concaved portion 102-CV in the semiconductor wafer 102. The shape of the opening portion OR1 is not particularly limited, and may be appropriately adjusted based on design requirements.

Figure 3:
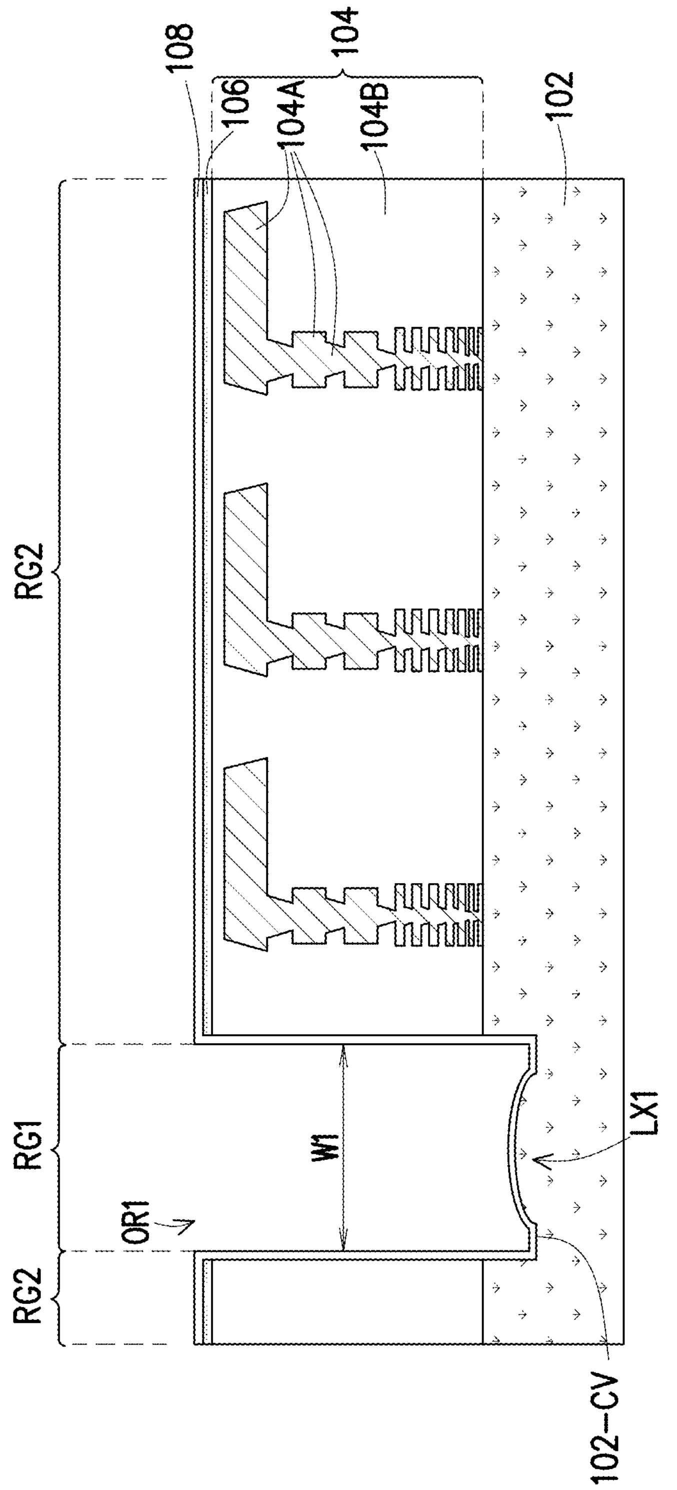

Referring to FIG. 3, after forming the opening portion OR1, the semiconductor wafer 102 may be further patterned to form optical concave/convex structure LX1. Although only one optical concave/convex structure LX1 is illustrated in FIG. 3, it is noted that there may be in fact a plurality of optical concave/convex structures LX1 formed by the semiconductor wafer 102. In some embodiments, the optical concave/convex structure LX1 are formed in the semiconductor wafer 102 by further removing portions of the semiconductor wafer 102 from the concaved portion 102-CV.

After forming the optical concave/convex structure LX1, a protection film 108 may be formed on the interconnection layer 104 over the passivation layer 106. In some embodiments, the protection film 108 is further formed on sidewalls of the opening portion OR1, and conformally formed on the concaved portion 102-CV of the semiconductor wafer 102. In certain embodiments, the protection film 108 is formed of silicon-containing materials, oxide materials, nitride materials, a combination thereof, or the like. In some other embodiments, a material of the protection film 108 is not particularly limited, and may be formed of inorganic materials, organic materials, metallic materials, polymeric materials, a combination thereof, or the like. Furthermore, the protection film 108 may be a single-layered film made of the above materials, or may include multiple stacked film layers made of the above materials.

In some embodiments, after forming the protection film 108, an optical region RG1 and a peripheral region RG2 are defined. In the exemplary embodiment, the optical region RG1 is a region in the electronic integrated circuit die 100 that allows the transmission of optical signals through the optical region RG1 towards other optical components. For example, as illustrated in FIG. 3, the optical region RG1 includes the plurality of optical concave/convex structures LX1 formed by the semiconductor wafer 102, and includes the protection film 108 formed over the optical concave/convex structures LX1. In the exemplary embodiment, the optical region RG1 has a width of W1, whereby the width W1 is defined by a distance between two opposing sidewalls of the protection film 108 in the opening portion OR1.

As further illustrated in FIG. 3, the optical region RG1 is free of metallization patterns 104A and dielectric layers 104B of the interconnection layer 104. In other words, the metallization patterns 104A and dielectric layers 104B of the interconnection layer 104 are formed in the peripheral region RG2. In some embodiments, the protection film 108 also extends from the optical region RG1 towards the peripheral region RG2. In some embodiments, the concaved portion 102-CV of the semiconductor wafer 102 is located in the optical region RG1, while other portions of the semiconductor wafer 102 are located in the peripheral region RG2. Furthermore, a top surface of the semiconductor wafer 102 in the peripheral region RG2 is located at a level higher than a top surface of the semiconductor wafer 102 (e.g. the concaved portion 102-CV with the optical concave/convex structure LX1) in the optical region RG1.

Figure 4:
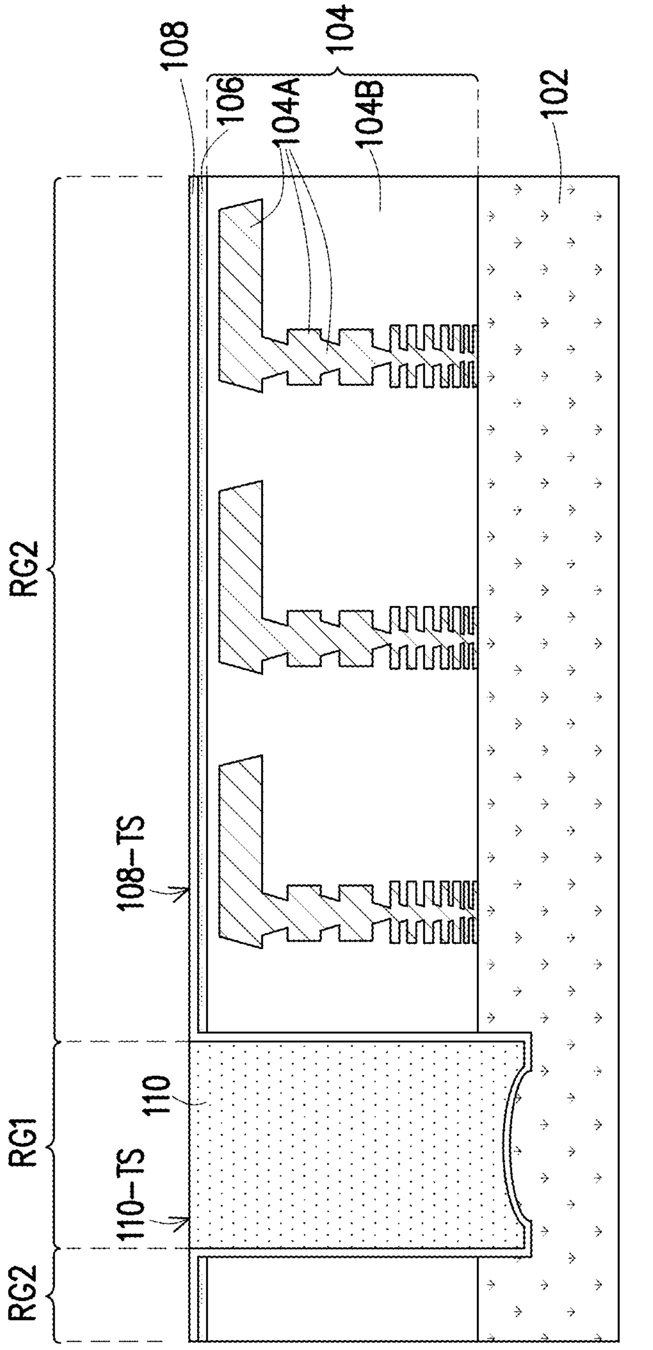

Referring to FIG. 4, in a subsequent step, a gap fill material 110 is formed in the opening portion OR1 of the interconnection layer 104, and formed in the optical region RG1. For example, the gap fill material 110 is formed on the protection film 108, and laterally surrounded by the interconnection layer 104. In certain embodiments, excess gap fill material 110 formed over the interconnection layer 104 may be removed by a planarization process, such as by a mechanical grinding process and/or a chemical mechanical polishing (CMP) process. After, the planarization process, a top surface 110-TS of the gap fill material 110 and a top surface of the protection film 108 are coplanar and aligned with one another. In the exemplary embodiment, the gap fill material 110 is formed of an optically transparent material (e.g. an optically transparent material layer). In certain embodiments, the gap fill material 110 is made of silicon oxide or polyimide.

Figure 5:
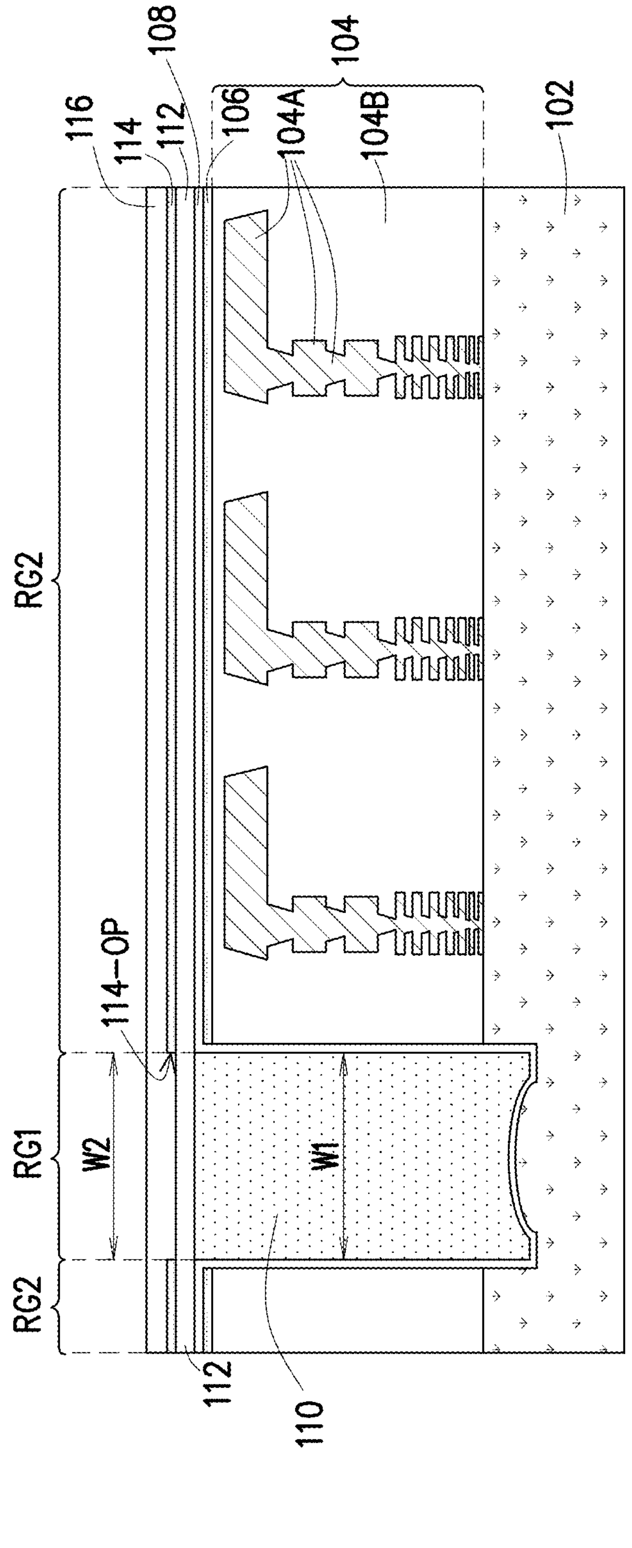

Referring to FIG. 5, in a subsequent step, a first dielectric layer 112, a capping layer 114 and a first bonding film 116 are formed over the protection film 108 and over the gap fill material 110. In some embodiments, the first dielectric layer 112 is formed to extend from the optical region RG1 to the peripheral region RG2. In some embodiments, the first dielectric layer 112 is formed of an optically transparent material (e.g. an optically transparent material layer). In certain embodiments, the first dielectric layer 112 is made of silicon oxide or polyimide. Furthermore, in some embodiments, the capping layer 114 is made of materials that may modulate or interfere with optical signal transmission, and may be made of materials such as silicon nitride, silicon carbide, silicon oxynitride, or the like.

Referring to FIG. 5, in order to prevent the presence of the capping layer 114 interfering with optical signal transmission, the capping layer 114 is formed with an opening section 114-OP that is overlapped with the opening portion OR1 (see FIGS. 2-3) of the interconnection layer 104, and overlapped with the optical region RG1. The method of forming the capping layer 114 having the opening section 114-OP is not particularly limited, and may be formed by photolithography, etching techniques, or formed using a mask layer. In some embodiments, sidewalls of the capping layer 114 at the opening section 114-OP are aligned with sidewalls of the protection film 108 disposed on the opening portion OR1. In some embodiments, a width W2 of the opening section 114-OP of the capping layer 114 is substantially equal to the width W1 of the optical region RG1.

As further illustrated in FIG. 5, the first bonding film 116 is formed over the capping layer 114 and located in the opening section 114-OP. For example, in the optical region RG1, the first bonding film 116 is directly stacked on top of the first dielectric layer 112. Furthermore, in the peripheral region RG2, the capping layer 114 is sandwiched in between the first dielectric layer 112 and the first bonding film 116. In some embodiments, the first bonding film 116 is formed of an optically transparent material (e.g. an optically transparent material layer). In certain embodiments, the first bonding film 116 is made of silicon oxide or polyimide.

Figure 6:
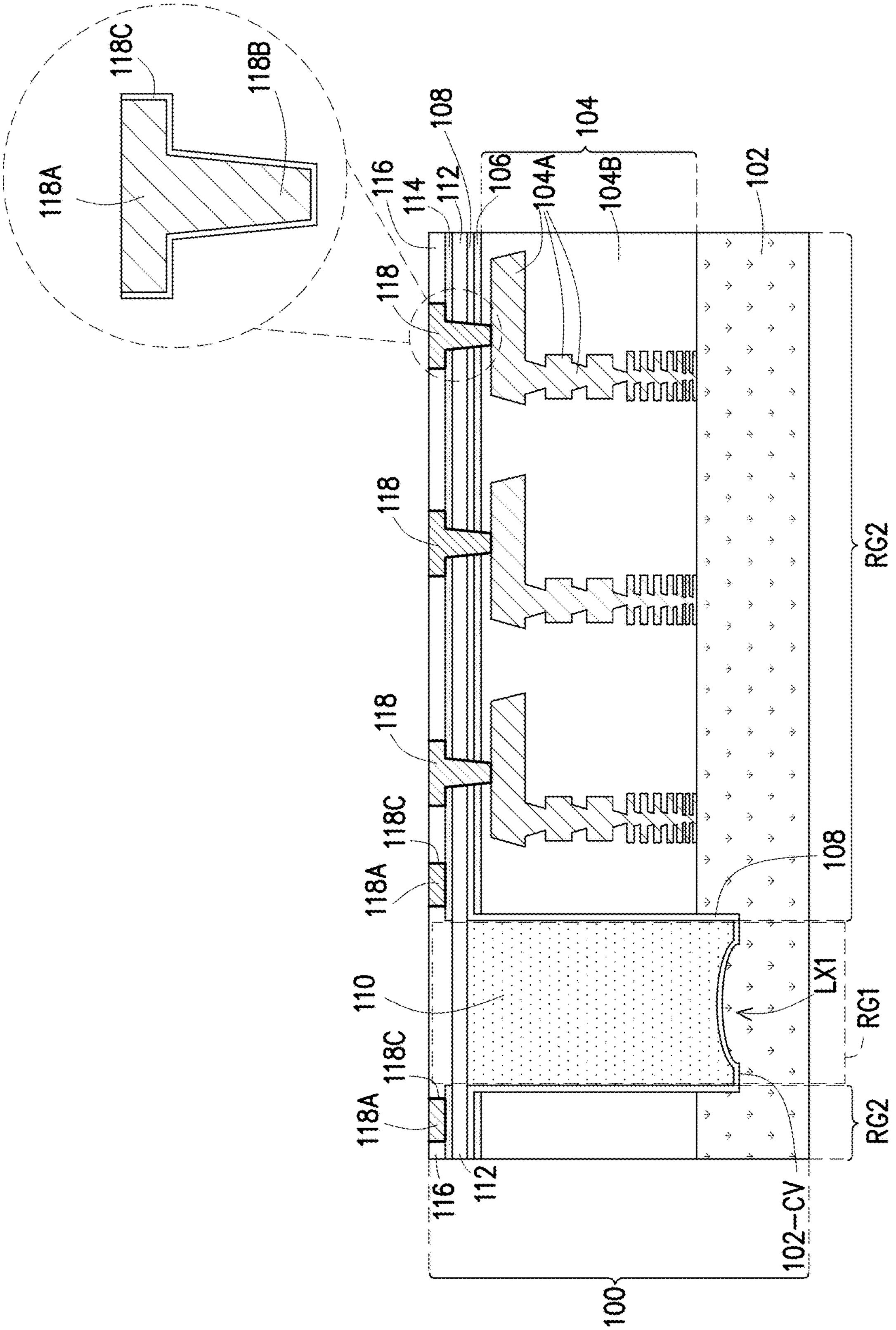

Referring to FIG. 6, in a subsequent step, the passivation layer 106, the protection film 108, the first dielectric layer 112, the capping layer 114 and the first bonding film 116 are patterned by various photolithography and etching steps to form openings revealing the metallization patterns 104A of the interconnection layer 104. Thereafter, a plurality of conductive patterns 118 is formed in the openings and connected to the metallization patterns 104A. For example, the conductive patterns 118 are formed using a suitable technique such as damascene, dual-damascene, plating, deposition, the like, or combinations thereof.

In the exemplary embodiment, forming the conductive patterns 118 includes forming a plurality of first bonding pads 118A, a plurality of via structures 118B connected to the first bonding pads 118A, and a barrier layer 118C surrounding the first bonding pads 118A and the via structures 118B. In some embodiments, the first bonding pads 118A are formed on the via structures 118B, whereby the first bonding pads 118A and the via structures 118B are formed of conductive materials such as copper, or the like. In certain embodiments, the barrier layer 118C is formed to prevent the conductive materials from diffusion to the adjacent layers (first bonding film 116), and may also provide the function of increasing the adhesion between the conductive materials and the adjacent layer. In some embodiments, the barrier layer 118C is formed of a metal nitride, such as titanium nitride, tantalum nitride, molybdenum nitride, zirconium nitride, hafnium nitride, or the like. In some other embodiments, the barrier later 118C may be omitted.

As illustrated in FIG. 6, the conductive patterns 118 are formed in the peripheral region RG2, and are not located in the optical region RG1. In the illustrated embodiment, the first bonding pads 118A are disposed on the capping layer 114 and a top surface of the first bonding pads 118 is revealed from the first bonding film 116. In some embodiments, the via structures 118B and the barrier layer 118C are connected to the first bonding pads 118A, and are laterally surrounded by the passivation layer 106, the protection film 108, the first dielectric layer 112, and the capping layer 114. In other words, the passivation layer 106, the protection film 108, the first dielectric layer 112, and the capping layer 114 may be in physical contact with the barrier layer 118C that is surrounding the via structures 118B. After forming the conductive patterns 118, an electronic integrated circuit die 100 in accordance with some embodiments of the present disclosure is accomplished.

Figure 7:
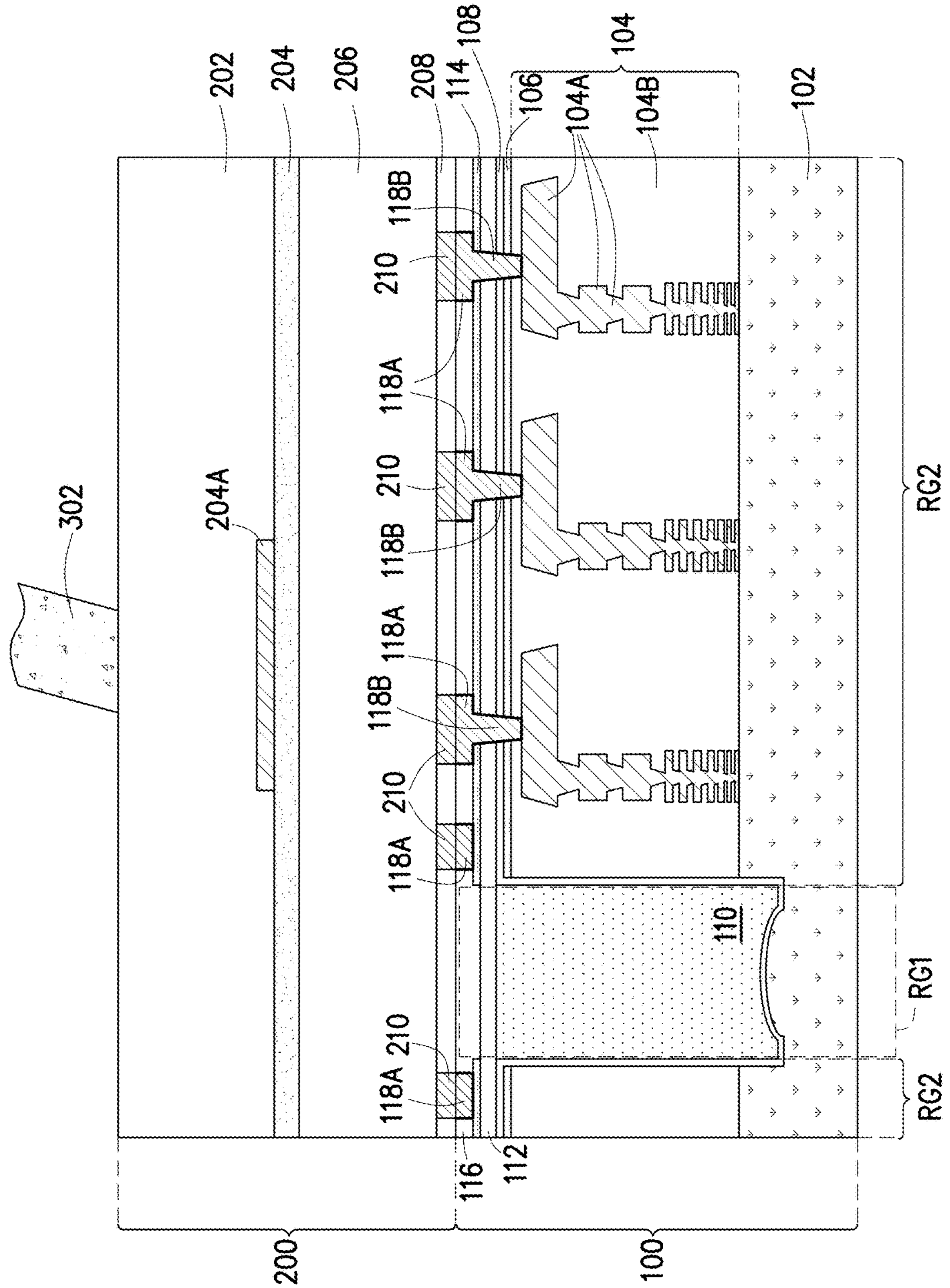

Referring to FIG. 7, in a subsequent step, a photonic integrated circuit die 200 is bonded to the electronic integrated circuit die 100. In the exemplary embodiment, the photonic integrated circuit die 200 includes a semiconductor wafer 202 (semiconductor structure), a photonic layer 204, an interconnection layer 206, a second bonding film 208 and a plurality of second bonding pads 210. In some embodiments, the semiconductor wafer 202 is for example, a silicon wafer, or any other optically transparent wafer, which may be singulated or diced at a later stage to form a semiconductor structure or substrate of the photonic integrated circuit die 200. The photonic layer 204 is located on the semiconductor wafer 202, and may comprise optical and optoelectronic devices, such as grating couplers 204A, waveguides, photodetectors, directional couplers, and modulators (not shown). In some embodiments, the photonic layer 204 is arranged to be overlapped with the opening portion OR1 or optical region RG1 of the electronic integrated circuit die 100. In some embodiments, an interconnection layer 206 is disposed on the photonic layer 204, and includes a plurality of metallization patterns (not shown) embedded therein for providing interconnection in the photonic integrated circuit die 200. In certain embodiments, an optically transparent material is embedded in the interconnection layer 206, which allows optical signals passing through the electronic integrated circuit die 100 to travel through. For example, portions of the interconnection layer 206 overlapped with the opening portion OR1 or optical region RG1 may be removed and filled with the optically transparent material.

As illustrated in FIG. 7, in some embodiments, the second bonding film 208 and the second bonding pads 210 are located on the interconnection layer 206. In some embodiments, the second bonding film 208 is formed of an optically transparent material (e.g. an optically transparent material layer). In certain embodiments, the second bonding film 208 is made of silicon oxide or polyimide. Furthermore, the second bonding pads 210 are embedded in the second bonding film 208, wherein the second bonding pads 210 are formed of conductive materials such as copper, or the like. In some embodiments, a barrier layer (not shown) may be optionally included to surround the second bonding pads 210, whereby the barrier layer may be formed of metal nitride, such as titanium nitride, tantalum nitride, molybdenum nitride, zirconium nitride, hafnium nitride, or the like. In some embodiments, the second bonding film 208 and the second bonding pads 210 of the photonic integrated circuit die 200 are bonded to the first bonding film 116 and first bonding pads 118A of the electronic integrated circuit die 100 through hybrid bonding. For example, the first bonding film 116 is directly joined with the second bonding film 208, while the first bonding pads 118A are directly joined with the second bonding pads 118A.

Referring to FIG. 7, a fiber structure 302 may be disposed over the photonic integrated circuit die 200. For example, the fiber structure 302 may be overlapped with the grating coupler 204A. In some embodiments, the fiber structure 302 is an optical input that transmits optical data/optical signal to the grating coupler 204A, whereby the optical data/optical signal may be further transmitted to other components along the photonic layer 204. In certain embodiments, light transmitted in the fiber structure 302 is projected onto the grating coupler 204A, and the grating coupler 204A has the function of receiving light and transmitting light to the photonic layer 204. After bonding the photonic integrated circuit die 200 to the electronic integrated circuit die 100, the semiconductor wafer 102 and the semiconductor wafer 202 are diced or singulated to respectively form a semiconductor structure 102 (or substrate) of the electronic integrated circuit die 100 and a semiconductor structure 202 (or substrate) of the photonic integrated circuit die 200.

Figure 8:
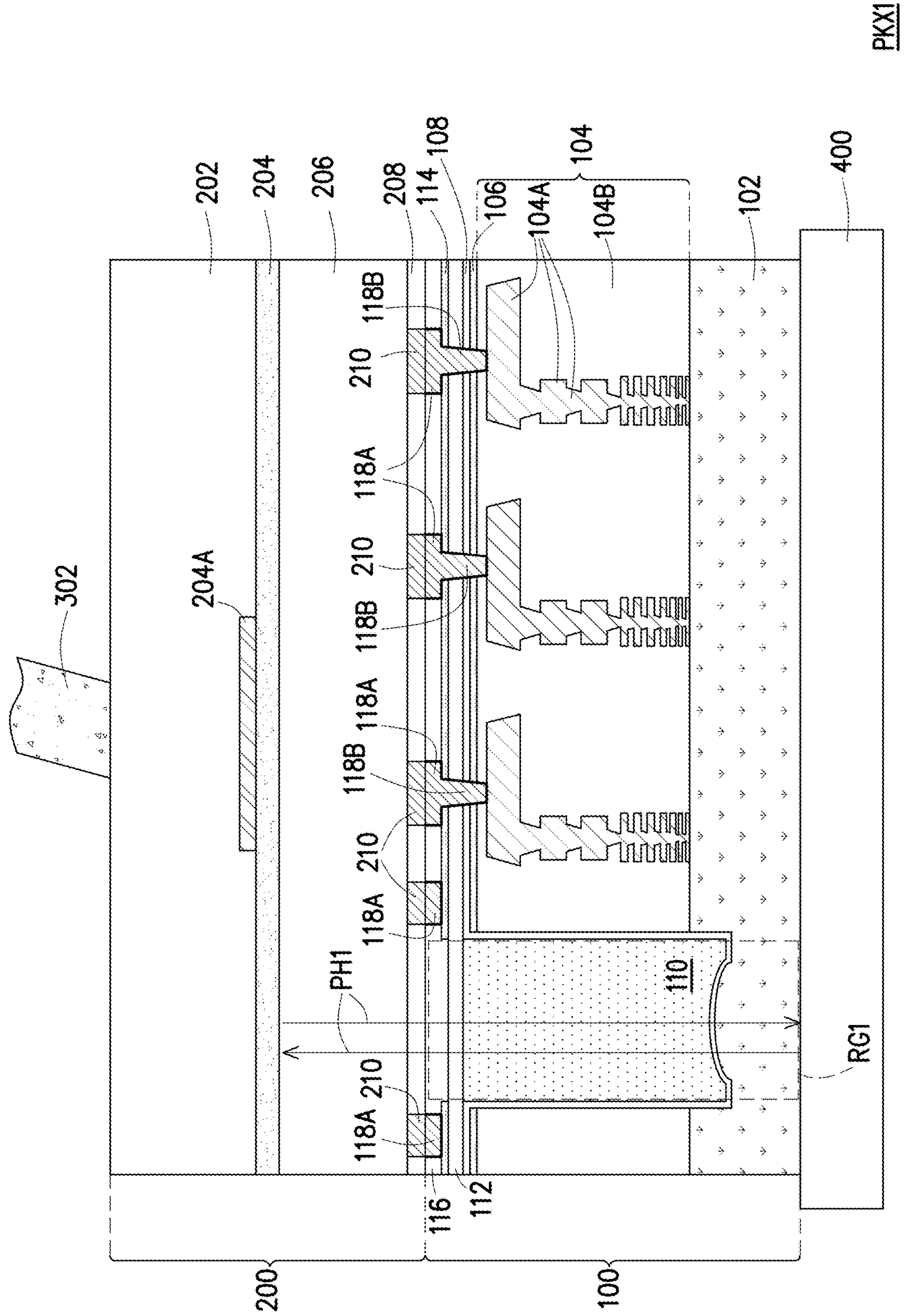

Referring to FIG. 8, in some embodiments, an optical device 400 may be further disposed on the electronic integrated circuit die 100. In one embodiment, optical signals are transferred by an optical path PH1 between the photonic layer 204 of the photonic integrated circuit die 200 and the optical device 400. For example, optical signals from the optical device 400 are transmitted along the optical path PH1 passing through the concaved portion 102-CV and the optical concave/convex structure LX1 of the semiconductor structure 102, passing through the protection film 108, the gap fill material 110, the first bonding film 116 and the second bonding film 208, and transmitted towards the photonic layer 204 of the photonic integrated circuit die 200. After providing the optical device 400, a semiconductor package PKX1 in accordance with some embodiments of the present disclosure is accomplished.

In the exemplary embodiment, in the semiconductor package PKX1, a vertical distance from a top surface of the protection film 108 on the concaved portion 102-CV (thus excluding the protection film 108 itself) to the photonic layer 204 along the optical path PH1 is free of materials selected from the group consisting of silicon nitride, silicon carbide and silicon oxynitride. In some embodiments, materials directly disposed on the optical concave/convex structures LX1 in the concaved portion 102-CV of the semiconductor structure 102 (e.g. the protection film 108) may be made of silicon nitride or silicon oxynitride, while materials not directly disposed on the optical concave/convex structures LX1 may further interfere with optical signal transmission. Thus, except for use in the protection film 108 for modulating optical signals, these materials are excluded along the optical path PH1. With the above configuration, an optical signal loss issue during optical transmission in the semiconductor package PKX1 can be prevented, and an optical performance of the semiconductor package PKX1 can be improved.

Figure 9:
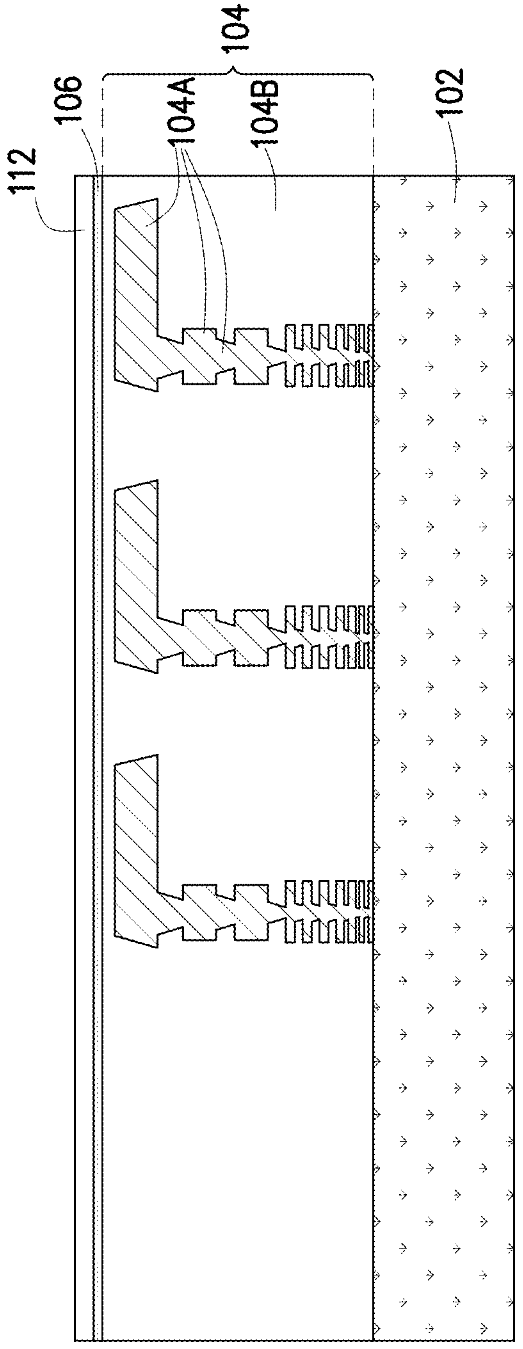
FIG. 9 to FIG. 13 are schematic top and sectional views of various stages in a method of fabricating a semiconductor package according to some other embodiments of the present disclosure.

FIG. 9 to FIG. 13 are schematic top and sectional views of various stages in a method of fabricating a semiconductor package according to some other embodiments of the present disclosure. The method illustrated in FIG. 9 to FIG. 13 is similar to the method illustrated in FIG. 1 to FIG. 8. Thus, the same reference numerals are used to refer to the same or liked parts, and its detailed description are omitted herein. Referring to FIG. 9, after providing the structure shown in FIG. 1, a first dielectric layer 112 is directly formed over the passivation layer 106. For example, the first dielectric layer 112 is directly contacting a top surface of the passivation layer 106.

Figure 10:
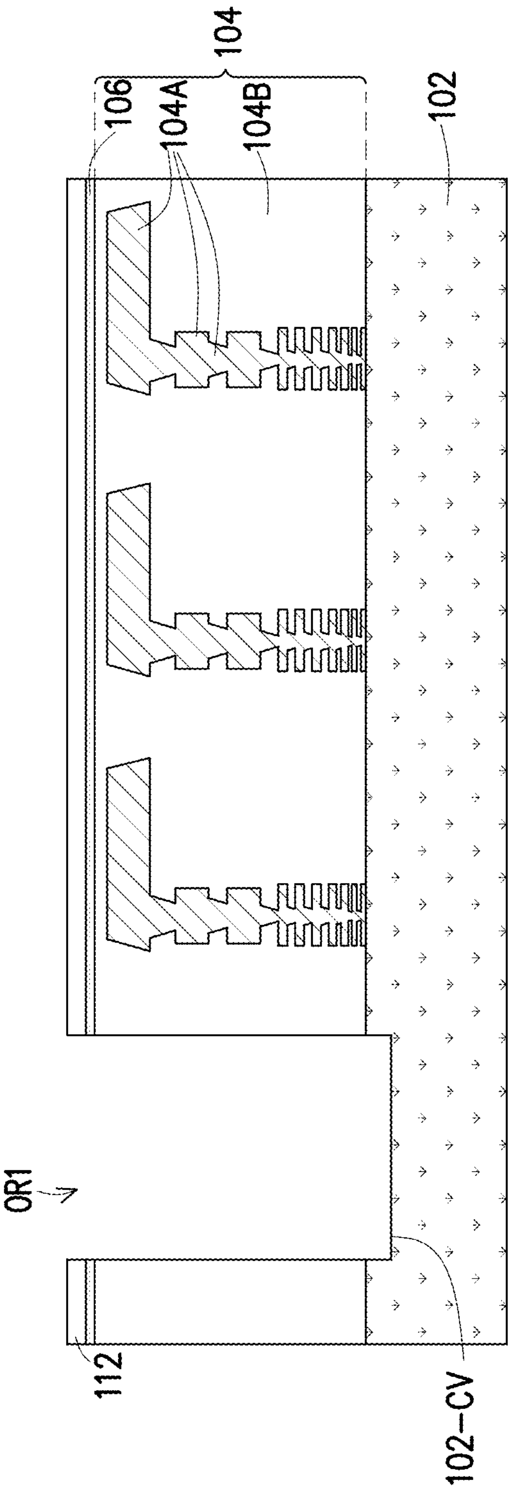

Referring to FIG. 10, in some embodiments, the interconnection layer 104, the passivation layer 106 and the first dielectric layer 112 are patterned to form an opening portion OR1. For example, portions of the interconnection layer 104, portions of the passivation layer 106 and portions of the first dielectric layer 112 are removed to form the opening portion OR1 that reveals the semiconductor wafer 102. In some embodiments, portions of the semiconductor wafer 102 are further removed to form a concaved portion 102-CV in the semiconductor wafer 102.

Figure 11:
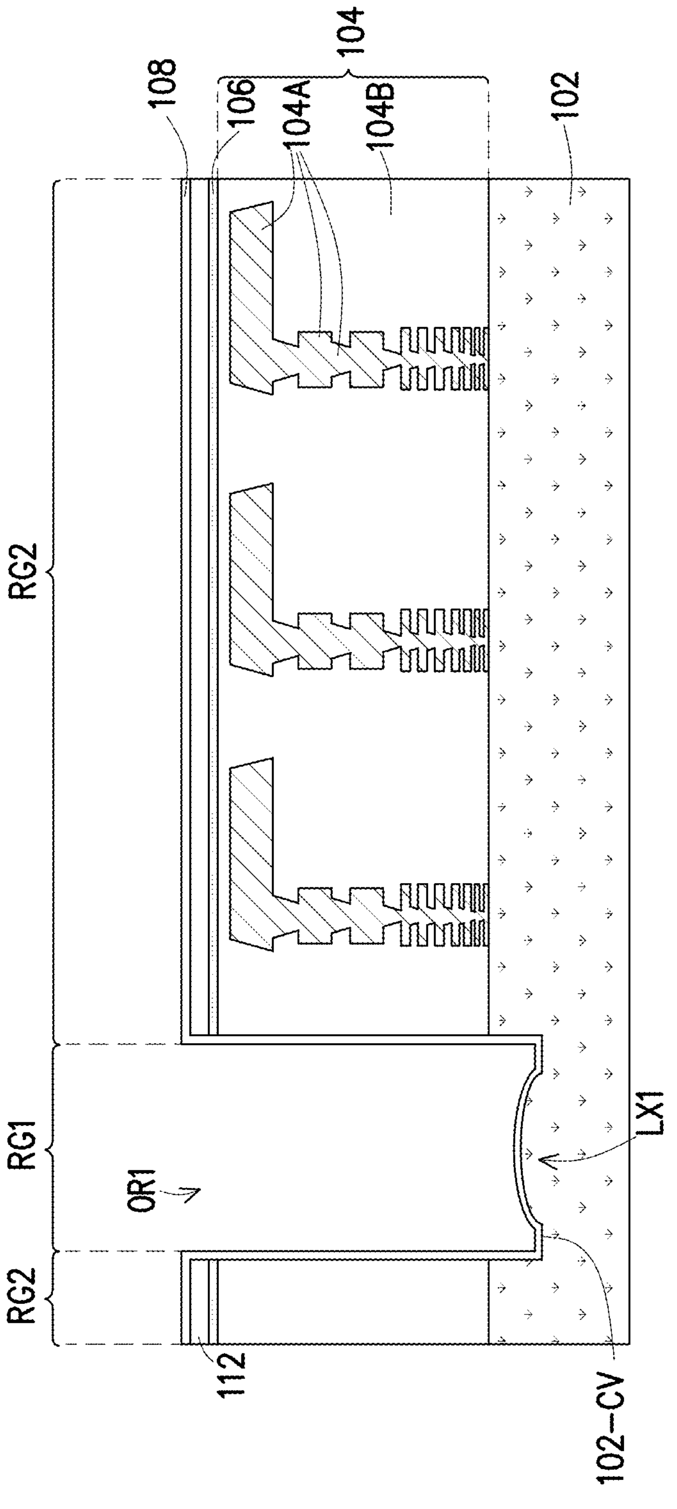

Referring to FIG. 11, in a subsequent step, the semiconductor wafer 102 is further patterned to form optical concave/convex structure LX1. Thereafter, a protection film 108 may be formed on the first dielectric layer 112 and in the opening portion OR1. For example, the protection film 108 is formed on sidewalls of the opening portion OR1, and conformally formed on the concaved portion 102-CV of the semiconductor wafer 102. In the exemplary embodiment, the protection film 108 may be used as an etching stop layer for subsequent formation of the conductive patterns 118, thus the capping layer 114 (shown in the first embodiment) is removed in this embodiment. In some embodiments, the protection film 108 is formed of silicon-containing materials, oxide materials, nitride materials, a combination thereof, or the like. In some other embodiments, a material of the protection film 108 is not particularly limited, and may be formed of inorganic materials, organic materials, metallic materials, polymeric materials, a combination thereof, or the like.

Figure 12:
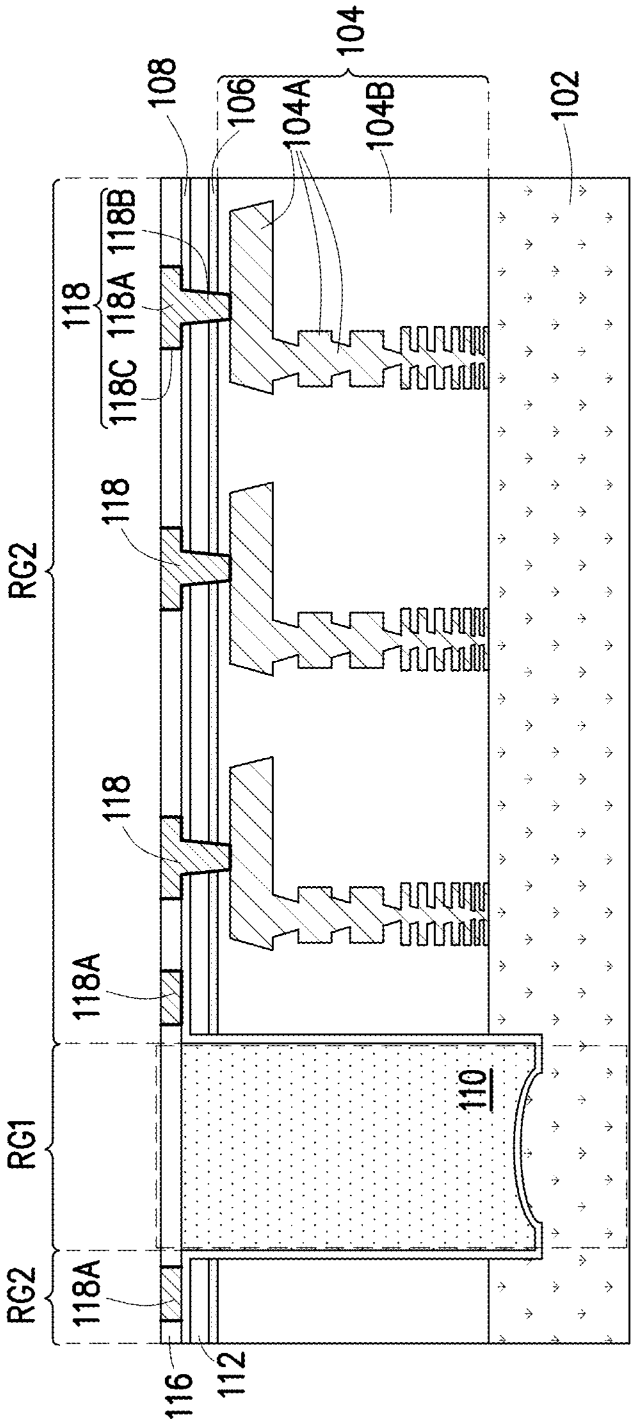

Referring to FIG. 12, after forming the protection film 108, a gap fill material 110 is formed in the opening portion OR1 of the interconnection layer 104, and formed in the optical region RG1. Thereafter, a first bonding film 116 is formed over the protection film 108, and conductive patterns 118 including a plurality of first bonding pads 118A, a plurality of via structures 118B, and a barrier layer 118C are formed over the protection film 108 and surrounded by the first bonding film 116. For example, the conductive patterns 118 are electrically connected to the metallization patterns 104A of the interconnection layer 104. Furthermore, the protection film 108, the first dielectric layer 112 and the passivation layer 106 are laterally surrounding the via structures 118B of the conductive patterns 118. After forming the conductive patterns 118, an electronic integrated circuit die 100 in accordance with some embodiments of the present disclosure is accomplished.

Figure 13:
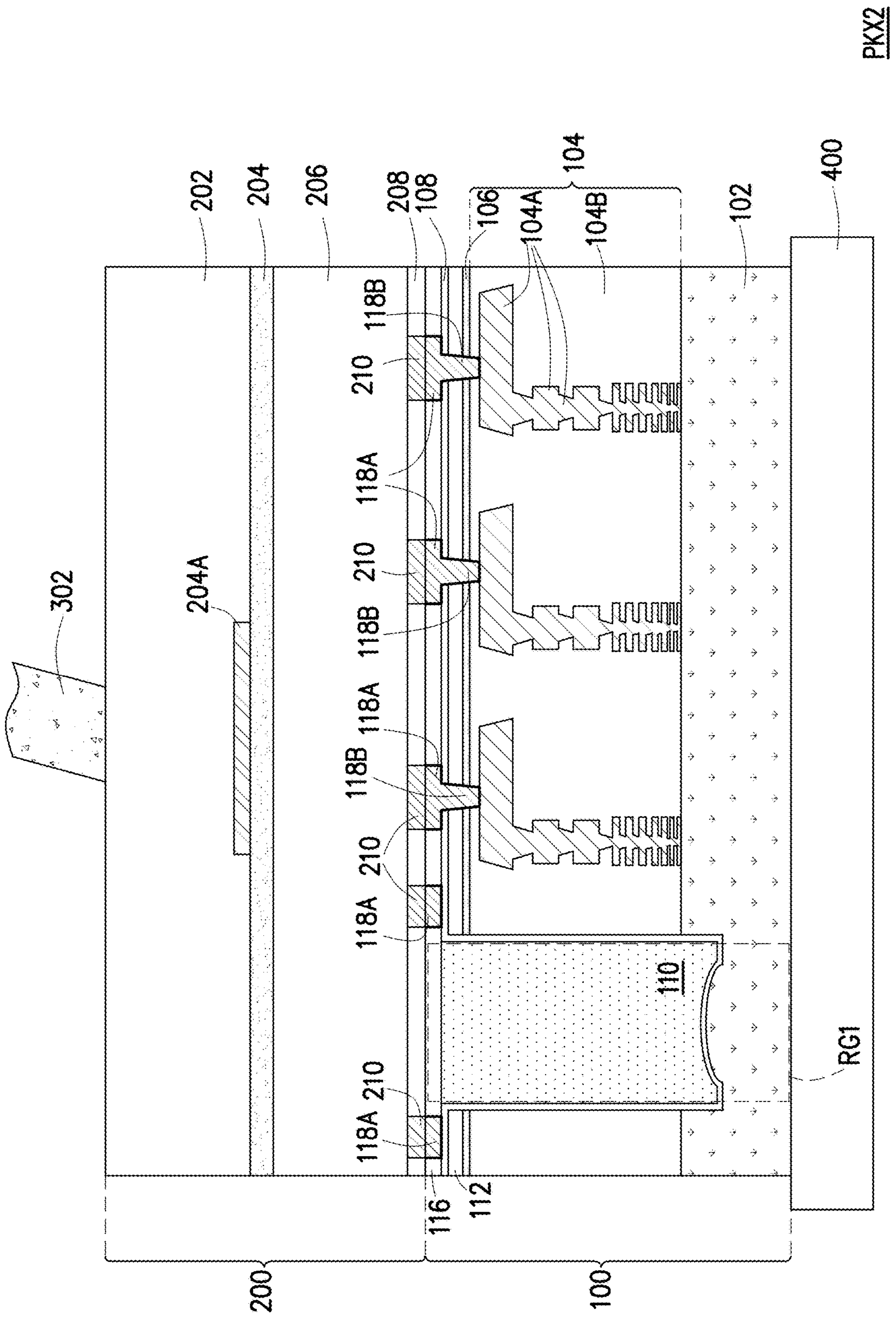

Referring to FIG. 13, in the same way as shown in FIG. 7 to FIG. 8, a photonic integrated circuit die 200 is bonded to the electronic integrated circuit die 100. Thereafter, a fiber structure 302 is disposed over the photonic integrated circuit die 200, and an optical device 400 may be further disposed on the electronic integrated circuit die 100. After providing the optical device 400, a semiconductor package PKX2 in accordance with some embodiments of the present disclosure is accomplished. In the exemplary embodiment, in the semiconductor package PKX2, a vertical distance from a top surface of the protection film 108 on the concaved portion 102-CV to the photonic layer 204 along the optical path PH1 (see position in FIG. 8) is free of materials selected from the group consisting of silicon nitride, silicon carbide and silicon oxynitride. As such, an optical signal loss issue during optical transmission in the semiconductor package PKX2 can be prevented, and an optical performance of the semiconductor package PKX2 can be improved.

Figure 14:
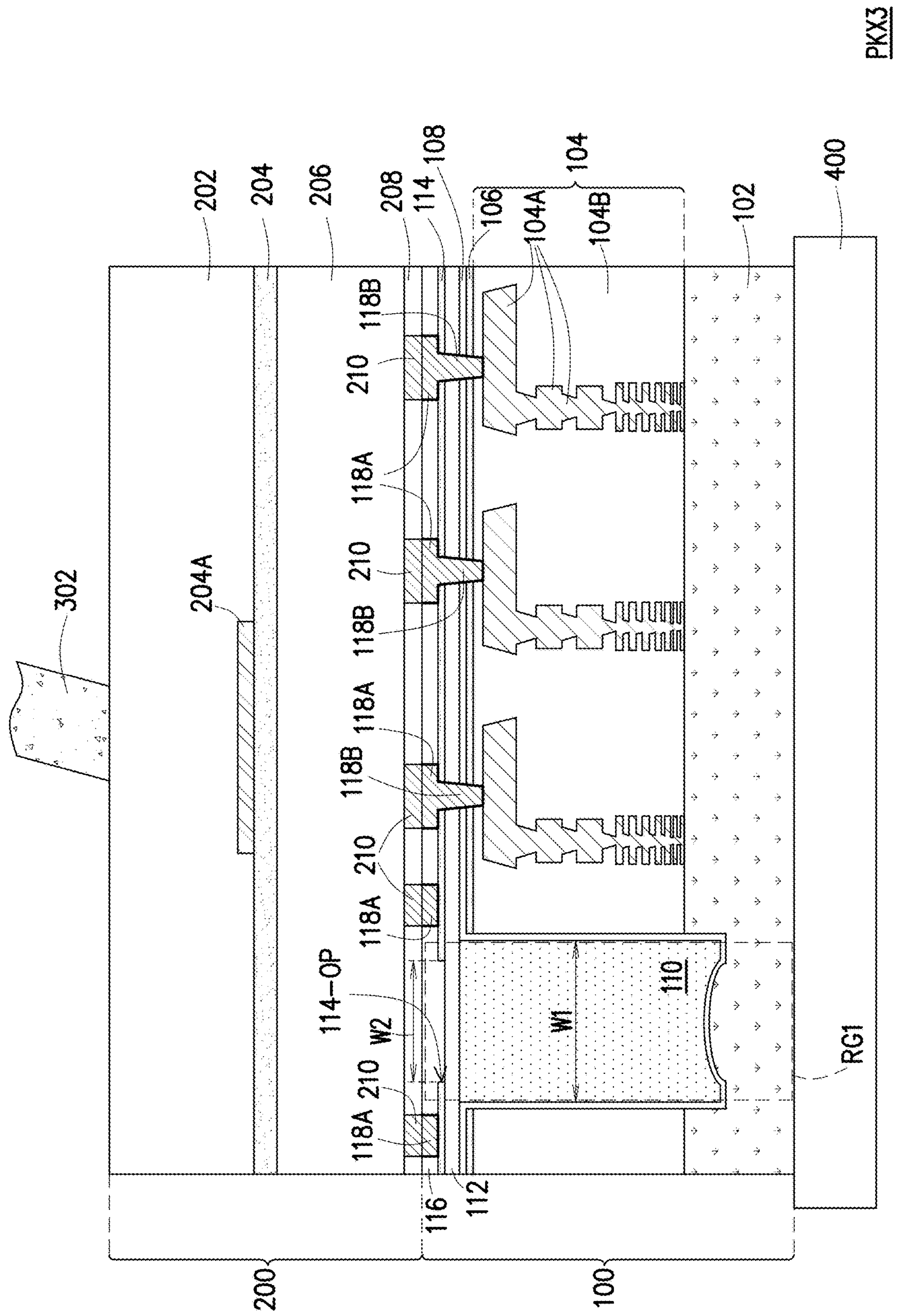
FIG. 14 is a schematic sectional view of a semiconductor package according to some other embodiments of the present disclosure.

FIG. 14 is a schematic sectional view of a semiconductor package according to some other embodiments of the present disclosure. The semiconductor package PKX3 illustrated in FIG. 14 is similar to the semiconductor package PKX1 illustrated in FIG. 8. Thus, the same reference numerals are used to refer to the same or like parts, and its detailed description is omitted herein. The difference between the embodiments is in the width W2 of the opening section 114-OP of the capping layer 114.

As shown in FIG. 14, the width W2 of the opening section 114-OP of the capping layer 114 is smaller than the width W1 of the optical region RG1. In other words, the sidewalls of the capping layer 114 are misaligned with sidewalls of the protection film 108 disposed on the opening portion OR1. In the exemplary embodiment, the opening section 114-OP of the capping layer 114 is still overlapped with the opening portion OR1 or optical region RG1 of the electronic integrated circuit die 100, and the capping layer 114 is non-overlapped or revealing a center of the optical concave/convex structure LX1. As such, this allows optical signals from the optical device 400 to transmit along the optical path PH1 towards the photonic layer 204 with minimal optical loss.

In the exemplary embodiment, in the semiconductor package PKX3, a vertical distance from a top surface of the protection film 108 on the optical concave/convex structure LX1 of the concaved portion 102-CV to the photonic layer 204 along the optical path PH1 (see position in FIG. 8) is free of materials selected from the group consisting of silicon nitride, silicon carbide and silicon oxynitride. As such, an optical signal loss issue during optical transmission in the semiconductor package PKX3 can be prevented, and an optical performance of the semiconductor package PKX3 can be improved.

Figure 15:
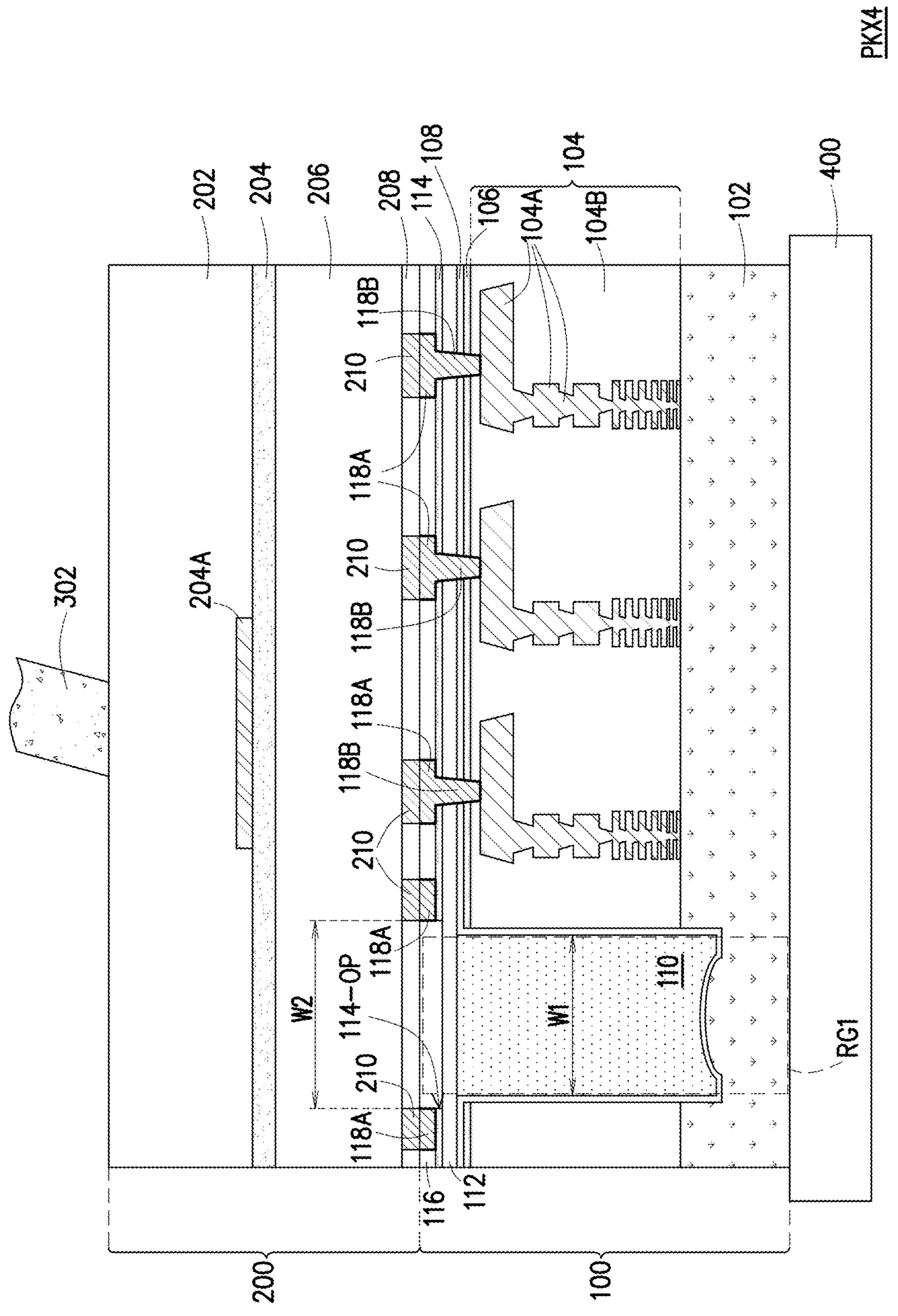
FIG. 15 is a schematic sectional view of a semiconductor package according to some other embodiments of the present disclosure.

FIG. 15 is a schematic sectional view of a semiconductor package according to some other embodiments of the present disclosure. The semiconductor package PKX4 illustrated in FIG. 15 is similar to the semiconductor package PKX1 illustrated in FIG. 8. Thus, the same reference numerals are used to refer to the same or like parts, and its detailed description is omitted herein. The difference between the embodiments is in the width W2 of the opening section 114-OP of the capping layer 114.

As shown in FIG. 15, the width W2 of the opening section 114-OP of the capping layer 114 is greater than the width W1 of the optical region RG1. In other words, the sidewalls of the capping layer 114 are misaligned with sidewalls of the protection film 108 disposed on the opening portion OR1. In the exemplary embodiment, the opening section 114-OP of the capping layer 114 is overlapped with the opening portion OR1 or optical region RG1 of the electronic integrated circuit die 100, and the capping layer 114 is non-overlapped or revealing a center of the optical concave/convex structure LX1. As such, this allows optical signals from the optical device 400 to transmit along the optical path PH1 towards the photonic layer 204 with minimal optical loss. In some embodiments, the conductive patterns 118 are formed above the capping layer 114. Thus, portions of the capping layer 114 without the conductive patterns 118 disposed thereon may be further removed during the formation of the opening section 114-OP to increase the width of the opening section 114-OP. For example, in some embodiments, the sidewalls of the capping layer 114 are aligned with sidewalls of the first bonding pads 118A.

In the exemplary embodiment, in the semiconductor package PKX4, a vertical distance from a top surface of the protection film 108 on the concaved portion 102-CV to the photonic layer 204 along the optical path PH1 (see position in FIG. 8) is free of materials selected from the group consisting of silicon nitride, silicon carbide and silicon oxynitride. As such, an optical signal loss issue during optical transmission in the semiconductor package PKX4 can be prevented, and an optical performance of the semiconductor package PKX4 can be improved.

Figure 16:
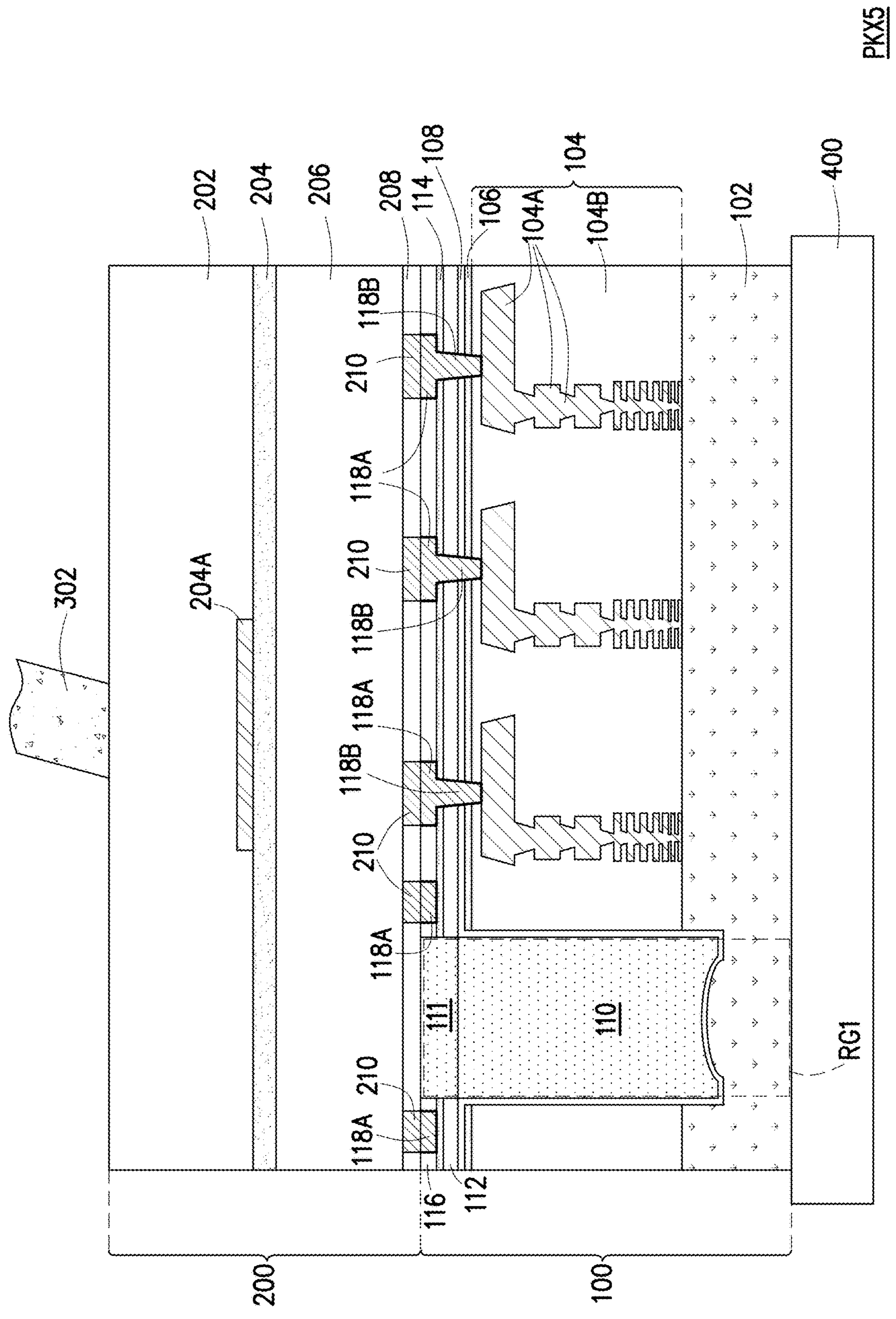
FIG. 16 is a schematic sectional view of a semiconductor package according to some other embodiments of the present disclosure.

FIG. 16 is a schematic sectional view of a semiconductor package according to some other embodiments of the present disclosure. The semiconductor package PKX5 illustrated in FIG. 16 is similar to the semiconductor package PKX1 illustrated in FIG. 8. Thus, the same reference numerals are used to refer to the same or like parts, and its detailed description is omitted herein. The difference between the embodiments is that the first dielectric layer 112 and the first bonding film 116 are further removed from the optical region RG1 of the semiconductor package PKX5.

Referring to the semiconductor package PX5 illustrated in FIG. 16, in some embodiments, the first dielectric layer 112 and the first bonding film 116 may be formed of any dielectric materials, whereby the dielectric materials may be optically transparent or non-optically transparent. In the exemplary embodiment, the first dielectric layer 112 and the first bonding film 116 are further removed from the optical region RG1 through a patterning process to reveal the gap fill material 110 underneath. Thereafter, a second gap fill material 111 may be formed over the gap fill material 110 to fill the optical region RG1. For example, the second gap fill material 111 is formed of an optically transparent material (e.g. an optically transparent material layer), and may be made of silicon oxide or polyimide.

In some embodiments, an interface exists in between the gap fill material 110 and the second gap fill material 111. Furthermore, the optically transparent material used in the gap fill material 110 may be the same or different as the optically transparent material used in the second gap fill material 111. In the exemplary embodiment, since the second gap fill material 111 is used to replace the first dielectric layer 112 and the first bonding film 116 in the optical region RG1, the first dielectric layer 112 and the first bonding film 116 may be formed of non-optically transparent materials without interfering with the optical transmission.

In a similar way, in the semiconductor package PKX5 of the present disclosure, a vertical distance from a top surface of the protection film 108 on the concaved portion 102-CV to the photonic layer 204 along the optical path PH1 (see position in FIG. 8) is free of materials selected from the group consisting of silicon nitride, silicon carbide and silicon oxynitride. As such, an optical signal loss issue during optical transmission in the semiconductor package PKX5 can be prevented, and an optical performance of the semiconductor package PKX5 can be improved.

In the above-mentioned embodiments, the electronic integrated circuit die (EIC die) and the photonic integrated circuit die (PIC die) are integrated or bonded together to form a semiconductor package, whereby the presence of capping layers in the optical path between the EIC die and the PIC are omitted from the semiconductor package. Furthermore, bonding pads or metal routings are also removed along the optical path. As such, an optical signal loss issue during optical transmission in the semiconductor package can be prevented, and an optical performance of the semiconductor package can be improved.

In accordance with some embodiments of the present disclosure, a semiconductor package includes an electronic integrated circuit die and a photonic integrated circuit die. The electronic integrated circuit die includes a semiconductor structure, an interconnection layer, a passivation layer, a protection film, a gap fill material and a plurality of first bonding pads. The semiconductor structure includes a concaved portion. The interconnection layer is disposed on the semiconductor structure, wherein the interconnection layer has an opening portion revealing the concaved portion of the semiconductor structure. The passivation layer is disposed on the interconnection layer. The protection film is disposed on the interconnection layer over the passivation layer, and on sidewalls of the opening portion, wherein the protection film is further disposed on the concaved portion of the semiconductor structure. The gap fill material is disposed in the opening portion of the interconnection layer and surrounded by the interconnection layer. The first bonding pads are disposed on the protection film. The photonic integrated circuit die is bonded to the electronic integrated circuit die and includes a photonic layer and a plurality of second bonding pads. The photonic layer is overlapped with the opening portion of the interconnection layer, wherein optical signals are transferred by an optical path between the photonic layer and the concaved portion of the semiconductor structure. The second bonding pads are disposed over the photonic layer, wherein the second bonding pads are directly bonded to the first bonding pads.

In accordance with some other embodiments of the present disclosure, a semiconductor package includes a photonic integrated circuit die having a photonic layer, and an electronic integrated circuit die bonded to the photonic integrated circuit die. The electronic integrated circuit die includes an optical region that allows the transmission of optical signals through the optical region towards the photonic layer, and a peripheral region outside of the optical region. The optical region includes a plurality of optical concave/convex structures, a protection film and optically transparent material layers. The optical concave/convex structures are formed by the semiconductor structure. The protection film is conformally disposed over the optical concave/convex structures, wherein the protection film extends over to the peripheral region. The optically transparent material layers are disposed over the protection film and filling up the optical region. The peripheral region includes a plurality of first bonding pads bonded to the photonic integrated circuit die, and a plurality of via structures connected to the plurality of first bonding pads, wherein the protection film is laterally surrounding sidewalls of the plurality of via structures.

In accordance with yet another embodiment of the present disclosure, a method of fabricating a semiconductor package is described. The method includes forming an electronic integrated circuit die by the following steps. A semiconductor structure is provided, and an interconnection layer is formed on the semiconductor structure. A passivation layer is formed on the interconnection layer. The interconnection layer is patterned to form an opening portion revealing the semiconductor structure, and portions of the semiconductor structure are removed to form a concaved portion in the semiconductor structure. A protection film is formed on the interconnection layer over the passivation layer, and on sidewalls of the opening portion, wherein the protection film is further formed on the concaved portion of the semiconductor structure. A gap fill material is formed in the opening portion of the interconnection layer and surrounded by the interconnection layer. A plurality of first bonding pads is formed on the protection film. The method further includes bonding a photonic integrated circuit die to the electronic integrated circuit die, wherein the photonic integrated circuit die includes a photonic layer and a plurality of second bonding pads. The photonic layer is overlapped with the opening portion of the interconnection layer, wherein optical signals are transferred by an optical path between the photonic layer and the concaved portion of the semiconductor structure. The second bonding pads are disposed over the photonic layer, wherein the second bonding pads is directly bonded to the first bonding pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an electronic integrated circuit die, comprising:
a semiconductor structure, comprising a concaved portion;
an interconnection layer disposed on the semiconductor structure, wherein the interconnection layer has an opening portion revealing the concaved portion of the semiconductor structure;
a passivation layer disposed on the interconnection layer;
a protection film disposed on the interconnection layer over the passivation layer, and on sidewalls of the opening portion, wherein the protection film is further disposed on the concaved portion of the semiconductor structure;
a gap fill material disposed in the opening portion of the interconnection layer and surrounded by the interconnection layer;
a plurality of first bonding pads disposed on the protection film;
a photonic integrated circuit die bonded to the electronic integrated circuit die, and comprising:
a photonic layer overlapped with the opening portion of the interconnection layer; and
a plurality of second bonding pads disposed over the photonic layer, wherein the plurality of second bonding pads is bonded to the plurality of first bonding pads.

2. The semiconductor package according to claim 1, wherein the concaved portion of the semiconductor structure further comprises a plurality of optical concave/convex structures formed by the semiconductor structure.

3. The semiconductor package according to claim 1, wherein a vertical distance from a top surface of the protection film on the concaved portion to the photonic layer is free of materials selected from the group consisting of silicon nitride, silicon carbide and silicon oxynitride.

4. The semiconductor package according to claim 1, further comprising a capping layer disposed below the plurality of first bonding pads, wherein the capping layer has an opening section that is overlapped with the opening portion of the interconnection layer.

5. The semiconductor package according to claim 4, wherein sidewalls of the capping layer at the opening section are aligned with sidewalls of the protection film disposed on the opening portion.

6. The semiconductor package according to claim 4, wherein sidewalls of the capping layer at the opening section are misaligned with sidewalls of the protection film disposed on the opening portion.

7. The semiconductor package according to claim 1, further comprising via structures electrically connecting the plurality of first bonding pads to the interconnection layer, wherein the via structures are laterally surrounded by the passivation layer and the protection film.

8. The semiconductor package according to claim 1, wherein the electronic integrated circuit die further comprises a first bonding film surrounding the plurality of first bonding pads, and the first bonding film is disposed on the protection film and over the gap fill material, and the photonic integrated circuit die further comprises a second bonding film surrounding the plurality of second bonding pads, and wherein the first bonding film is attached to the second bonding film.

9. A semiconductor package, comprising:
a photonic integrated circuit die comprising a photonic layer;
an electronic integrated circuit die bonded to the photonic integrated circuit die, and comprising an optical region overlapped with the photonic layer, and a peripheral region aside from the optical region,
wherein the optical region comprises;
a plurality of optical concave/convex structures formed by a semiconductor structure;
a protection film disposed over the plurality of optical concave/convex structures, wherein the protection film extends over to the peripheral region; and
optically transparent material layers disposed over the protection film and filling up the optical region;
wherein the peripheral region comprises:
a plurality of first bonding pads bonded to the photonic integrated circuit die; and a plurality of via structures connected to the plurality of first bonding pads, wherein the protection film is laterally surrounding sidewalls of the plurality of via structures.

10. The semiconductor package according to claim 9, wherein the optical region consists of the plurality of optical concave/convex structures, the protection film and the optically transparent material layers, and wherein the optically transparent material layers are made of silicon oxide or polyimide.

11. The semiconductor package according to claim 10, wherein the optically transparent material layers include a gap fill material layer disposed on the protection film and at least a first dielectric layer disposed on the gap fill material layer, wherein a top surface of the gap film material layer is aligned with a top surface of the protection film.

12. The semiconductor package according to claim 9, further comprising a capping layer disposed on the protection film, wherein the capping layer comprises an opening section overlapped with the optical region.

13. The semiconductor package according to claim 12, wherein a width of the opening section is smaller than a width of the optical region.

14. The semiconductor package according to claim 12, wherein a width of the opening section is equal to a width of the optical region.

15. The semiconductor package according to claim 9, wherein the peripheral region further comprises a passivation layer laterally surrounding the sidewalls of the plurality of via structures and in contact with sidewalls of the protection film.

* * * * *